United States Patent
Estes et al.

[11] Patent Number: 5,818,313
[45] Date of Patent: Oct. 6, 1998

[54] MULTILAYER LOWPASS FILTER WITH SINGLE POINT GROUND PLANE CONFIGURATION

[75] Inventors: John C. Estes; Richard Kommrusch; Rong Fong Huang, all of Albuquerque, N. Mex.

[73] Assignee: Motorola Inc., Schaumburg, Ill.

[21] Appl. No.: 792,588

[22] Filed: Jan. 31, 1997

[51] Int. Cl.$^6$ .............................. H01P 1/20; H03H 7/01
[52] U.S. Cl. ............................ 333/262; 333/204
[58] Field of Search ............................ 333/176, 184, 333/185, 202, 204, 219

[56] References Cited

U.S. PATENT DOCUMENTS

| | | | |
|---|---|---|---|
| 4,673,903 | 6/1987 | Sand | 333/210 |
| 4,800,348 | 1/1989 | Rosar et al. | 333/202 |
| 4,896,124 | 1/1990 | Schwent | 333/206 |
| 5,173,671 | 12/1992 | Wendler et al. | 333/185 |
| 5,192,926 | 3/1993 | Sogo et al. | 333/204 |
| 5,278,526 | 1/1994 | Ikeda | 333/185 |
| 5,319,328 | 6/1994 | Turunen | 333/202 |
| 5,357,227 | 10/1994 | Tonegawa et al. | 333/204 X |
| 5,373,271 | 12/1994 | Hirai et al. | 333/205 |
| 5,404,118 | 4/1995 | Okamura et al. | 333/185 X |
| 5,446,430 | 8/1995 | Yamanaka et al. | 333/202 |
| 5,461,352 | 10/1995 | Noguchi et al. | 333/204 |
| 5,467,065 | 11/1995 | Turunen et al. | 333/132 |
| 5,479,141 | 12/1995 | Ishizaki et al. | 333/204 |
| 5,610,565 | 3/1997 | Maeda et al. | 333/185 |

*Primary Examiner*—Sgungsook Ham
*Attorney, Agent, or Firm*—Gary J. Cunningham; Colin M. Raufer

[57] ABSTRACT

A laminated lowpass filter (100) is disclosed. The filter (100) has: a stack of dielectric substrates (301–312) having a ground via (118); a pi network coupled between an input (202) and an output (202'); a first leg comprising a first transmission line (608) and a first capacitance (C1) connected to a top ground plane (GP1); a second leg comprising a second transmission line (608') and a second capacitance (C2) connected to a bottom ground plane (GP2); a middle leg including a transmission line (606) is between the first and second leg; the single point ground plane configuration prevents ground loops and minimizes the passage of stray signals through the laminated lowpass filter (100).

10 Claims, 6 Drawing Sheets

MULTILAYER LOWPASS FILTER WITH SINGLE POINT GROUND PLANE CONFIGURATION

FIELD OF THE INVENTION

This invention relates to multilayer ceramic packages, and more particularly, to a multilayer lowpass filter with a single point ground plane configuration.

BACKGROUND OF THE INVENTION

Multilayer ceramic lowpass filters are known in the art. These filters discriminate between signals by passing signals in a desired, predetermined frequency band (i.e. pass the signal from the input to the output of the filter unattenuated), while preventing the transmission of signals on the high side of the predetermined frequency band. One problem with small multilayer packages is that as their size decreases, undesirable coupling occurs between internal circuit components resulting in "crosstalk" or "noise" which reduces the effectiveness of the filter. This may produce unwanted transmissions from portable radio and cellular communication products. The generation of "crosstalk" or "noise" results in the degradation of the performance of a system utilizing such filters.

Unwanted coupling also causes "flyback" in the area where harmonic rejection is required. Flyback is a term-of-art used to describe a situation where the filter response provides less attenuation after previously providing greater attenuation. For example, a filter response may only offer 10 dB of attenuation at a third harmonic due to coupling between internal capacitor components, whereas at the second harmonic, the attenuation may have been 20–30 dB. This flyback in the harmonic rejection region is generally undesirable. Still another problem with decreasing size is the creation of ground loops inside the multilayer integrated packages. A ground loop is a term-of-art used to describe the propagation of a signal through a package along an unintended path or along a route not contemplated by the package design.

For emerging digital telecommunication technologies, the prior art lowpass filters have too great an insertion loss value in the passband and can no longer meet the decreasing size requirements of cellular telephone and other electronic equipment manufacturers.

Figure 7:
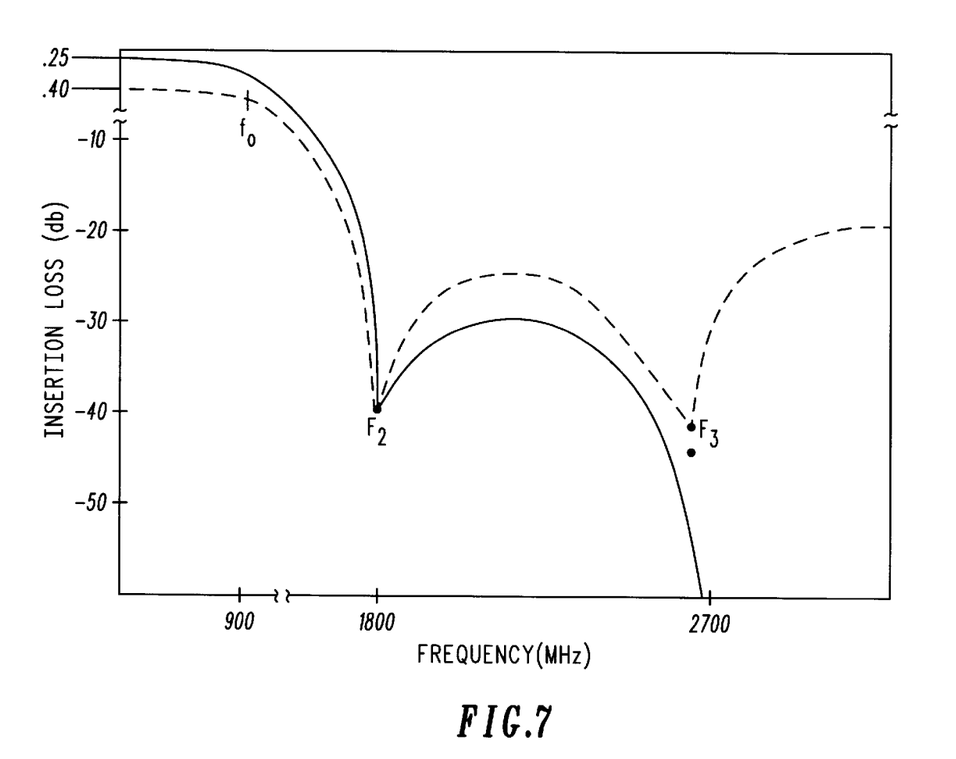
FIG. 7 shows a graph of the frequency response for a prior art lowpass filter as well as the lowpass filter of the present invention.

FIG. 7 shows a frequency response for a prior art lowpass filter (dashed line). Although its harmonic rejection values of 40 dB at the second ($F_2$) and third ($F_3$) harmonics are acceptable for many telecommunication applications, the Insertion Loss value of 0.40dB is undesirably high for many emerging digital and other telecommunication applications.

One method of providing for decreasing size requirements and also providing for the integration of many components into a single integrated ceramic package involves a grounding technique which uses separated grounds in the form of a single point ground plane. This grounding technique virtually eliminates ground loops in the multilayer package thereby effectively eliminating unwanted noise and undesirable crosstalk in the system.

A multilayer lowpass filter with a single point ground plane configuration which has very low insertion loss in the passband and provides suitable harmonic rejection, in a small package and simple design, would be an improvement in the art.

DETAILED DESCRIPTION OF THE PREFERRED EMBODIMENT

Figure 1:
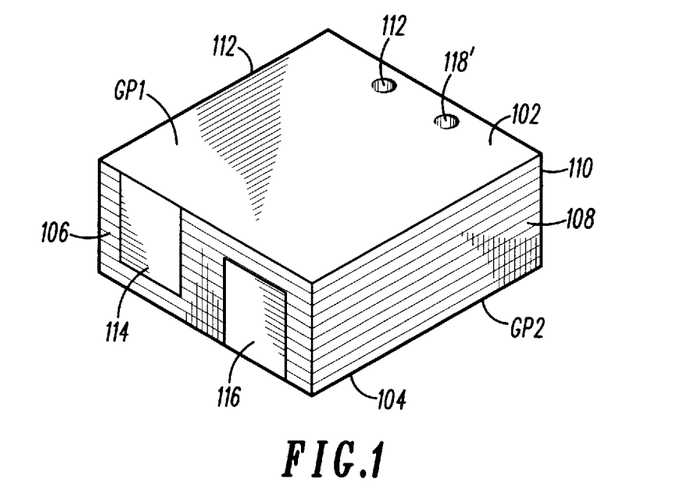
FIG. 1 shows one embodiment of a multilayer lowpass filter with a single point ground plane configuration in accordance with the present invention.

FIG. 1 shows a view of a multilayer lowpass filter 100 having a top surface 102, a bottom surface 104, and four side surfaces 106, 108, 110, and 112 respectively. This multilayer package is made from a stack of dielectric substrates which are then laminated under pressure and temperature and fired into a single ceramic multilayer package. The top surface of filter 100 is substantially coated with a conductive material defining a first or top ground plane GP1.

In FIG. 1, the top ground plane has two small vias, 118, 118', shown in phantom, which actually extend through every sheet of dielectric from the top ground plane GP1 to a bottom ground plane GP2. Vias 118, 118' are filled with a conductive paste material and provide for a direct path between the ground planes. Vias 118, 118' could also be replaced by a metallization pattern on a side surface of the package provided it maintained suitable grounding between the top ground plane GP1 and the bottom ground plane GP2.

The bottom surface 104 is substantially covered with a conductive coating with the exception of an unmetallized area surrounding input and output pads defining a second or bottom ground plane GP2 (see description of FIG. 2 below). The side surfaces 108, 110 and 112 are substantially uncoated or unmetallized.

In lowpass filter 100, a single point ground plane configuration is realized by a side surface metallization arrangement in which a pair of side surface metallization patterns 114, 116 extend to alternative or opposite ground planes. Referring to FIG. 1, one metallization pattern 114 on surface 106 extends to the first ground plane GP1 on the top surface 102 of the lowpass filter 100. Similarly, the other metallization pattern 116 on surface 106 extends to the second ground plane GP2 on the bottom surface 104 of the lowpass filter 100. These side metallization patterns are also significantly connected to selective internal components inside the multilayer package. More specifically, the metallization pattern 114 connects to the ground plates of capacitor C1 (see exploded view in FIG. 3) and the metallization pattern 116 connects to the ground plates of capacitor C2 (see exploded view in FIG. 3). This unique grounding configuration prevents ground loops and allows for a smaller sized package which is easy to manufacture at low cost.

In this embodiment of the present invention, lowpass filter 100 has a single point ground plane configuration which is apparent from the metallization pattern on side surface 106 of the multilayer ceramic package. On side surface 106, a side metallization ground plane configuration can be seen. Referring to side surface 106, a pair of metallization patterns 114, 116 are strategically positioned on side surface 106 to form a unique single point ground configuration. Metallization pattern 114 connects a set of internal electroded capacitor plates (C1 in FIG. 3) also called a first capacitance to the top ground plane GP1. Similarly, metallization pattern 116 connects a set of internal electroded capacitor plates (C2 in FIG. 3) also called a second capacitance to the bottom ground plane GP2.

The metallization pattern in this embodiment will be a conductive silver composition which can be applied in a post-laminating operation. This silver metallization pattern can be applied by a variety of conventional deposition techniques including, but not limited to, screen printing, dipping, rolling, brushing, and spraying. Any technique which provides a uniform coating which does not cause shorts would be considered within the scope of this invention.

By purposefully connecting one set of capacitor plates to a top ground plane and another set of capacitor plates to a bottom ground plane, a single point ground plane configuration which prevents ground loops and allows for a smaller sized package can be achieved.

In lowpass filter 100, it is possible to integrate various circuit elements directly into the layers of the multilayer package. For example, resistors, capacitors, helical coils, transmission lines and inductors may be screen-printed or otherwise deposited directly onto the ceramic sheets, using a predetermined electrode pattern. Additionally, many of the layers of dielectric sheets may be printed with an electrode pattern or left unpatterned depending upon specific designs.

Figure 2:
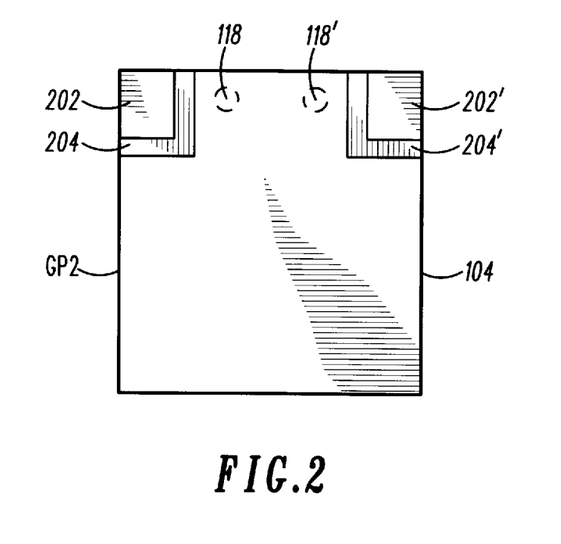
FIG. 2 shows a plan view of the bottom surface of the lowpass filter of FIG. 1 in accordance with the present invention.

FIG. 2 shows a view of the bottom surface 104 of lowpass filter 100. This view shows an input pad 202 and an output pad 202' which are surrounded by uncoated areas of dielectric material 204, 204' respectively. This input-output configuration, as shown in FIG. 2, allows filter 100 to be easily surface mounted onto a printed circuit board using conventional manufacturing techniques. From this view, vias 118, 118' are shown in phantom between the input and output pads. The entire bottom surface is substantially coated with a conductive material to form a second ground plane GP2.

Figure 3:
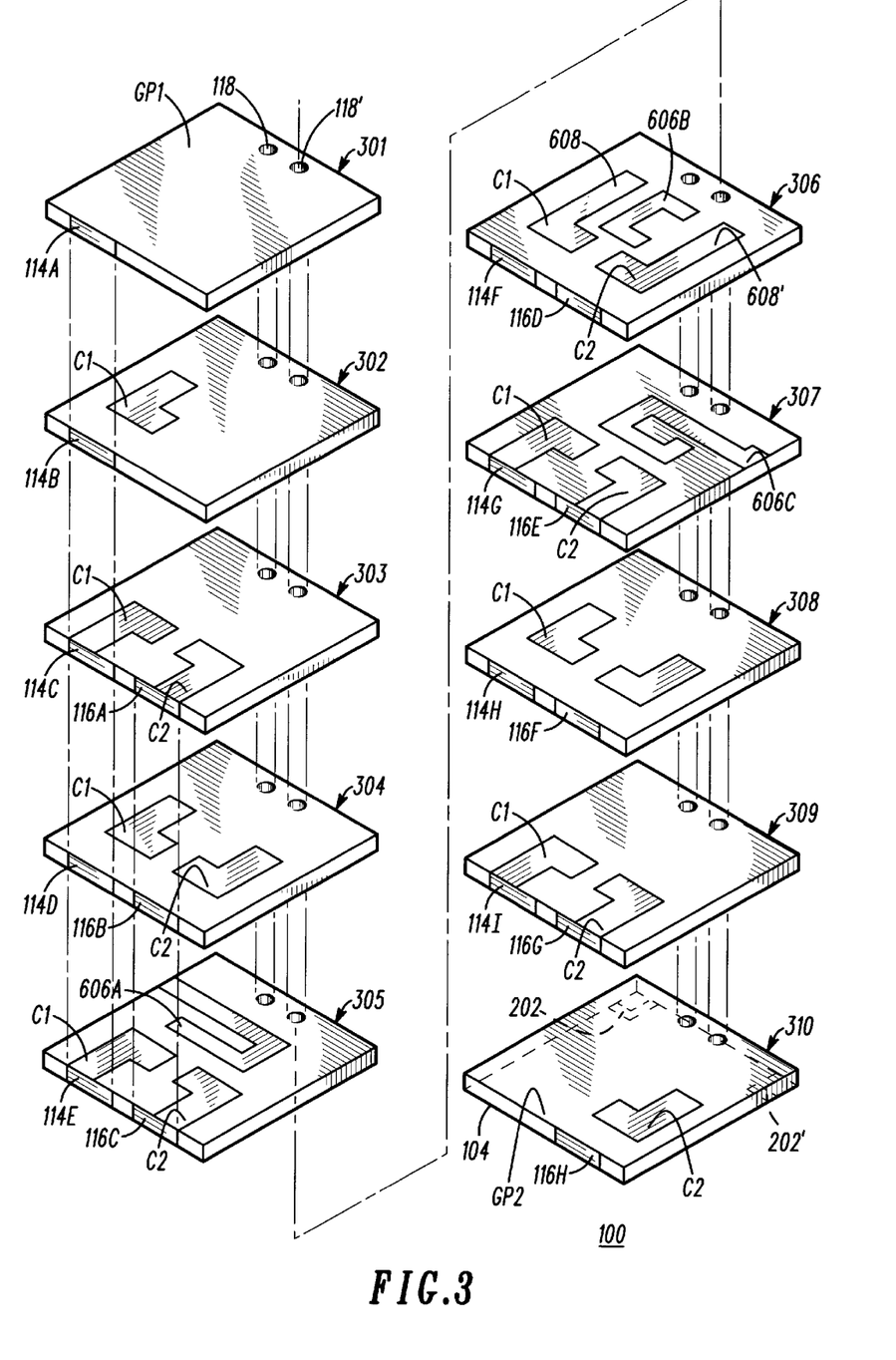
FIG. 3 shows an exploded view of the lowpass filter of FIG. 1 in accordance with the present invention.

FIG. 3 shows an exploded view of filter 100, from which all electrode pattern layers can be viewed and substantially all internal features can be recognized. In FIG. 3, an internal transmission line runs through the multilayer package with electrode components on the surfaces of each dielectric sheet forming a traditional pi network circuit design. It is the pi network design that propagates the electromagnetic signal through the various layers in the multilayer lowpass filter package 100 to predetermined circuit elements. More specifically, the pi network design determines specifically which electrode components are positioned on each of the dielectric sheets 301–310.

Referring to FIG. 3, a set of ten dielectric sheets of ceramic numbered 301 through 310 are laminated to form lowpass filter 100. The top sheet 301 contains the conductively coated top ground plane GP1 on the top surface 102 of the package. Also, conductively filled vias 118, 118' are shown in phantom on sheet 301. Additionally, a portion of the side metallization pattern 114A is on a side surface of sheet 301, and connects to the top ground plane GP1.

The second dielectric sheet 302 contains a portion of the side metallization pattern 114B, as well as two via holes 118, 118'. An important feature of dielectric sheet 302 is that it contains only one capacitor plate C1. A second capacitor plate C2, which is found on the other layers, has been purposefully omitted from this layer as a design consideration in order to more effectively isolate the ground planes and prevent ground loops. By effectively removing capacitor plate C2 on sheet 302, the top ground plane GP1 is more isolated from the C2 stack of capacitor plates. Similarly, dielectric sheet number 310, discussed in detail below, is also selectively isolated.

The third dielectric sheet 303 contains two electrode capacitor plate patterns C1, C2 as well as conductive vias 118, 118'. Vias 118, 118' extend from the top ground plane GP1 to the bottom ground plane GP2, and are shown as dashed lines through the dielectric sheets 301–310. Side metallization pattern 114C is on a side surface of dielectric sheet 303 and is grounded to the top ground plane GP1. Similarly, side metallization pattern 116A is on a side surface of dielectric sheet 303 and is grounded to the bottom ground plane GP2.

The fourth dielectric sheet 304 also contains two capacitor plates C1, C2, deposited as an electrode pattern on its top surface. Ground vias 118, 118' extend through sheet 304. Additionally, the side surface metallization patterns 114D and 116B are on a side surface of sheet 304.

The fifth dielectric sheet 305 also has two capacitor plates C1, C2 deposited thereon. Sheet 305 also has side metallization patterns 114E, 116C as well as ground vias 118, 118'. Additionally, sheet 305 is the first sheet containing a layer of a helical coil transmission line structure 606A–606C on dielectric sheets 305–307. Electrode pattern 606A on sheet 305 forms a first layer of the helical coil transmission line structure 606. It is important to note that the entire helical coil transmission line structure extends through the dielectric plates through a set of via holes which are not shown in FIG. 3. These vias holes have been purposefully omitted in order to allow FIG. 3 to focus on the unique single point grounding configuration of the present invention.

The sixth dielectric sheet 306 also contains two electrode capacitor elements C1, C2 respectively, as well as another electrode layer 606B of the helical coil transmission line structure located substantially toward the center of sheet 306. Sheet 306 also has ground vias 118, 118' and side metallization patterns 114F and 116D. Sheet 306 also has a first transmission line 608 and a second transmission line deposited on its top surface. The first capacitor C1 and the second capacitor C2 are strategically positioned substantially at the ends of transmission lines 608, 608'.

The seventh dielectric sheet 307 contains two capacitor plate electrode elements C1, C2. Helical coil transmission line structure 606C and ground vias 118, 118' are also on sheet 307. Once again, side metallization patterns 114G and 116E are also located on a side surface of sheet 307.

The eighth dielectric sheet 308 has capacitor plates C1, C2 deposited on its top surface. Ground vias 118, 118' and side metallization patterns 114H and 116F are also on sheet 308.

The ninth sheet 309 is similar to sheet 308 in that it contains capacitor plates C1, C2, ground vias 118, 118', and side metallization patterns 114I and 116G.

The tenth and final sheet 310 is coated with a conductive material on its bottom surface 104 to form the second ground plane GP2. The input pad 202 and the output pad 202' are also shown on the bottom surface of dielectric sheet 310.

Side metallization pattern 116H connects a second capacitor plate C2 to the bottom ground plane GP2. Just as the side metallizations 114A–114I connected the first capacitor plate C1 to the top ground plane GP1, the side metallizations 116A–116H connect the second capacitor plate to the bottom ground plane GP2. The first capacitor plate C1, which is found on the other layers, has been purposefully omitted from this layer (dielectric sheet 310) as a design consideration in order to more effectively isolate the ground planes and prevent ground loops. By effectively removing capacitor plate C1 on sheet 310, the bottom ground plane GP2 is more isolated from the C1 stack of capacitor plates.

The multilayer capacitor design which uses multilayer capacitor plates C1, C2 forming pairs of alternately stacked ground plane layers is a design commonly used in the multilayer packaging industry. More specifically, the capacitor plates on sheets 303, 305, 307, and 309 are connected directly to the ground planes. The capacitor plates of sheets 302, 304, 306, 308 and 310 are also connected together with vias (not shown). When an electric field is applied across the capacitor plates on consecutive layers, the dielectric layer therebetween causes the package to perform as a multilayer capacitor.

A unique feature of the present design is that by grounding one set of capacitor plates C1 to a top ground plane GP1 and a second set of capacitor plates C2 to a bottom ground plane GP2, ground loops are effectively eliminated and a single ground point configuration is achieved.

One advantage of the present design is that only a few components are utilized as elements in the filter. More specifically, the filter contains only five elements in the multilayer package, namely a pair of capacitor plates C1 and C2, two transmission lines 608, 608', and a helical coil transmission line structure 606. This is notable because from a design perspective, the addition of elements in a structure leads to improved harmonic rejection at the expense of increasing insertion loss inside the passband of interest.

Stated another way, the simple design of filter 100, with a limited number of elements, allows for the low insertion loss value inside the passband to be achieved, while also providing suitable harmonic rejection outside of the passband. The present design eliminates the ground loop problem which is often seen in small multilayer packages. As a result, the present design achieved low loss and high rejection in a small package with few internal components. However, higher order harmonic filters may also be enhanced by the single point ground plane configuration of the present invention.

A major factor which provides the desirable low loss characteristics found in the present filter is the introduction of the ground plane configuration which isolates the circuit elements and also allows for a small package design. With this single point ground plane design, the lowpass filter may offer reduced passband insertion loss while also maintaining adequate harmonic rejection.

One particularly useful application for the present lowpass filter design is for digital cellular telephones. Whereas typical analog cellular telephones must contend with many harmonics, digital cellular telephones have a power amplifier which runs in a linear mode. Typical analog cellular telephones have a power amplifier designed to run at saturation. As such, a digital cellular telephone has fewer harmonics to contend with (relative to an analog cellular telephone), resulting in a harmonic rejection specification which is not as rigid or strict, resulting in a filter design where a lowpass filter having very low insertion loss inside the passband is desirable. The present invention provides a lowpass filter which offers both harmonic rejection and very low loss in the form of low insertion loss values inside the passband.

The lowpass filter 100 may be used between an antenna and a duplex filter or between an antenna and a switch in a digital cellular telephone. In this application, the lowpass filter will provide a low loss path for both the transmit and receive signal. Another application for this lowpass filter can be a low loss path for the transmit signal which is positioned immediately following the power amplifier in a digital cellular telephone. Still another application includes placement of a lowpass filter in a transceiver circuit between an antenna and at least one of a power amplifier and a receiver.

As should be understood by those skilled in the art, the ground plane configuration as shown in lowpass filter 100 may also be used for the design of filters at other frequencies. For example, in addition to 900 MHz, a lowpass filter at 1800 MHz, 1900 MHz, or other frequencies in the electromagnetic spectrum are also contemplated by the present invention.

Figure 4:
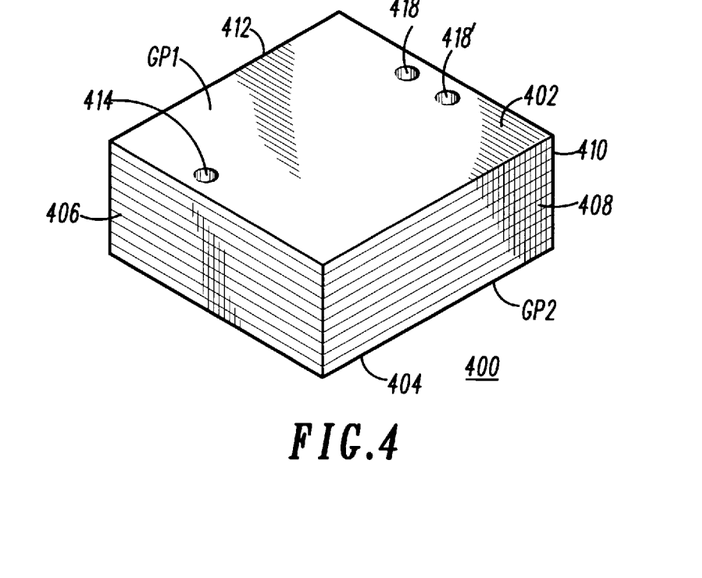
FIG. 4 shows another embodiment of a multilayer lowpass filter with a single point ground plane configuration in accordance with the present invention.
Figure 5:
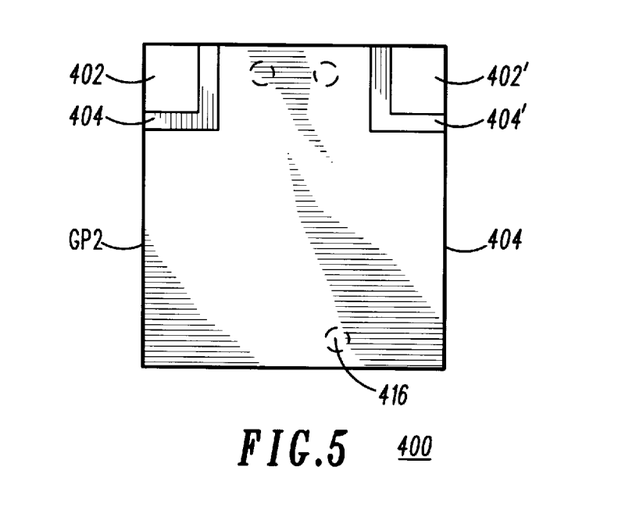
FIG. 5 shows a plan view of the bottom surface of the lowpass filter of FIG. 4 in accordance with the present invention.
Figure 6:
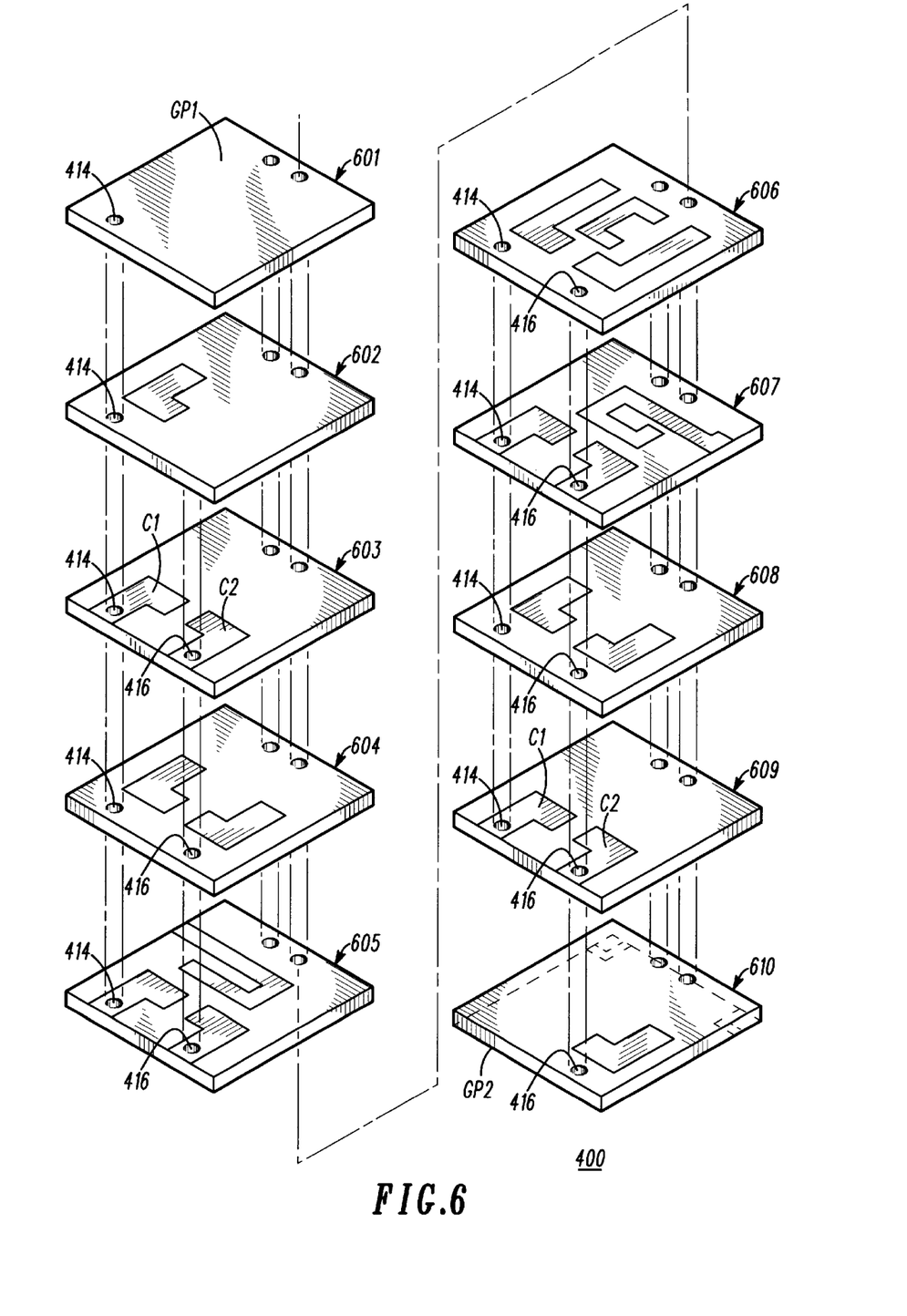
FIG. 6 shows an exploded view of the lowpass filter of FIG. 4 in accordance with the present invention.

Another embodiment of the present invention is shown with reference to FIGS. 4–6. FIGS. 4–6 are substantially the same as FIGS. 1–3 with one significant difference being the technique by which the capacitor plates C1 and C2 are grounded to the first and second ground planes GP1, GP2 respectively. As such, with the exception of the differences which are discussed and specifically numbered, all other numbered components of FIGS. 1–3 are incorporated by reference into FIGS. 4–6.

Referring to FIG. 4, a view of a multilayer lowpass filter 400 having a top surface 402, a bottom surface 404, and four side surfaces 406, 408, 410, and 412 respectively is provided. This multilayer package is made from a stack of dielectric substrates which are then laminated under pressure and temperature and fired into a single ceramic multilayer package. The top surface of filter 400 is substantially coated with a conductive material defining a first or top ground plane GP1.

In FIG. 4, the top ground plane has two small vias, 418, 418', shown in phantom, which actually extend through every sheet of dielectric from the top ground plane GP1 to a bottom ground plane GP2. Vias 418, 418' are filled with a conductive paste material and provide for a direct path between the ground planes.

The bottom surface 404 is substantially covered with a conductive coating with the exception of an unmetallized area surrounding input 402 and output 402' pads defining a second or bottom ground plane GP2 (see description of FIG. 5 below). In this embodiment, all of the side surfaces 406, 408, 410, and 412 are substantially uncoated or unmetallized.

In lowpass filter 400, a single point ground plane configuration is realized by a single ground via arrangement in which a pair of single ground vias 414, 416 extend to alternative ground planes. Referring to FIG. 4, one ground via 414 extends through the stack of first capacitor plates C1 to the first ground plane GP1 on the top surface 402 of the lowpass filter 400. In FIG. 4, ground via 414 is shown in phantom on the top surface 402 of filter 400. Similarly, the other ground via 416 extends through the second set of capacitor plates C2 to the second ground plane GP2 on the bottom surface 404 of the lowpass filter 400. Ground via 416 is shown in phantom in FIG. 5. These ground vias 414, 416 are also significantly connected to selective internal components in the multilayer package. More specifically, the ground via 414 connects to the ground plates of capacitor C1 (see exploded view in FIG. 6) and the ground via 416 connects to the ground plates of capacitor C2 (see exploded view in FIG. 6). This unique grounding configuration prevents ground loops and allows for a smaller sized package which is easy to manufacture at low cost.

FIG. 5 shows a view of the bottom surface 404 of lowpass filter 400. This view shows an input pad 402 and an output pad 402' which are surrounded by uncoated areas of dielectric material 404, 404' respectively. This input-output configuration, as shown in FIG. 5, allows filter 400 to be easily surface mounted onto a printed circuit board using conventional manufacturing techniques. From this view, vias 418, 418' are shown in phantom between the input and output pads, and ground via 416 is shown to be aligned with the second set of capacitor plates C2. The entire bottom surface is substantially coated with a conductive material to form a second ground plane GP2.

The use of ground vias 414, 416, which are internal to the package, to form the unique single point grounding configuration offers many advantages from a manufacturing perspective. Ground via designs are particularly adaptable to large scale manufacturing processes and ground via designs and processing techniques in multilayer are well known. Thus, a preferred embodiment will contain a ground via design in which one ground via 414 is strategically positioned to connect the first capacitor C1 to the top ground plane GP1, and a second ground via 416 is strategically positioned to connect the second capacitor C2 to the bottom ground plane GP2.

FIG. 6 shows an exploded view of the lowpass filter 400 of FIG. 4. Lowpass filter 400 is made from ten sheets of dielectric ceramic numbered consecutively from 601 through 610. In this embodiment, ground via 414 extends from the top ground plane GP1 of sheet 601 through each layer until it terminates on sheet 609. Ground via 416 extends from the bottom ground plane GP2 of sheet 610 through each layer until it terminates on sheet 603. Close examination of FIG. 6 reveals that while ground vias 414, 416 extend through their respective capacitor plates C1, C2 on the odd numbered sheets, they extend carefully through unmetallized areas of dielectric on even numbered sheets. This is an important design feature because it prevents the capacitor plates from shorting and it allows for the single point ground plane configuration of the present invention.

Another advantage of the filters 100, 400 is that the ground plane configuration design allows for a very small package design in which there is substantially no cross-talk or noise because stray capacitance between the shunt capacitors or capacitive elements C1 and C2 is substantially minimized (or eliminated). This is significant because a necessary consequence of reduced package size is a design where capacitive elements C1 and C2 (also called shunt capacitors) must be in close proximity to each other on the dielectric sheet. An unfortunate result of moving these capacitors close to each other is that they couple energy to each other and provide paths for harmonics to be transmitted from input to output.

The helical design is still another important aspect of this design. The helical design is achieved by providing metallization patterns in the form of transmission lines on each of the many multilayer sheets of dielectric material to form a helical coil transmission line structure (606A–606C in FIG. 3). The electrical path is completed when connection vias are placed in the dielectric sheets to connect successive layers of electrode patterning.

In a preferred embodiment, all ground plane vias 118, 118', 414, 416, 418, 418' will be made from a silver (Ag) material. Of course, any conductive material may be used for the ground vias provided the conductive material is adaptable to multilayer processing requirements and can be produced in a form that may be readily used as a via filling material. Other possible conductive materials can include, but are not limited to, platinum (Pt), copper (Cu) and gold (Au).

FIG. 7 shows a graph of the frequency response for a prior art lowpass filter (dashed line) as well as the lowpass filter of the present invention (solid line). In FIG. 7, Insertion Loss, measured in decibels (dB) is shown along the vertical axis and Frequency, measured in Mega-Hertz (MHz) is shown along the horizontal axis. The prior art lowpass filters have an insertion loss of about 0.40 dB inside the passband and approximately 40 dB at the second ($F_2$) and third ($F_3$) harmonics.

A sample was prepared using the ground plane configuration design of FIGS. 1–3 and a frequency response substantially as shown in the solid line in FIG. 7 was obtained. The sample showed an improved Insertion Loss of only 0.25 dB inside the passband which can be defined as located to the left of the fundamental frequency ($f_0$) in FIG. 7. At both the second and third harmonics, the sample met or exceeded prior art performance characteristics. The ability of a lowpass filter 100, 400 to provide very low loss inside the passband is desirable for many present and future cellular telephone designs and other electronic applications.

Figure 8:
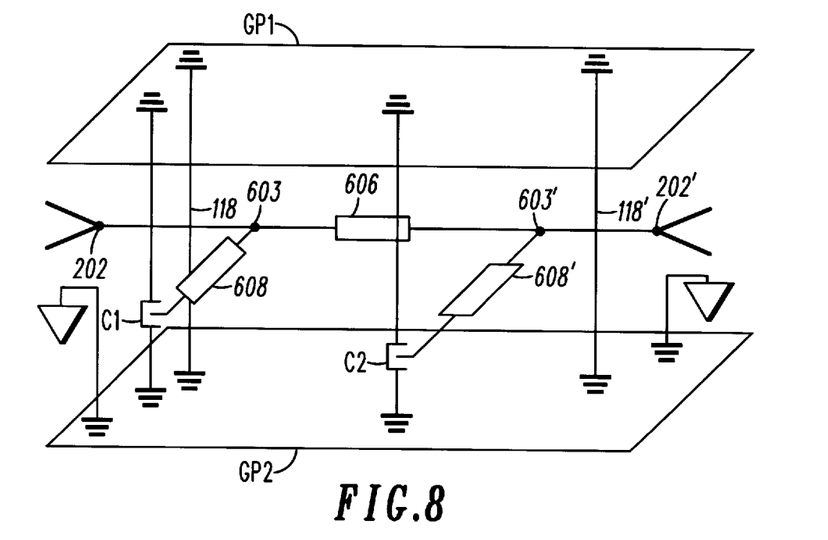
FIG. 8 shows an equivalent circuit diagram of a lowpass filter without the single point ground plane configuration of the present invention.
Figure 9:
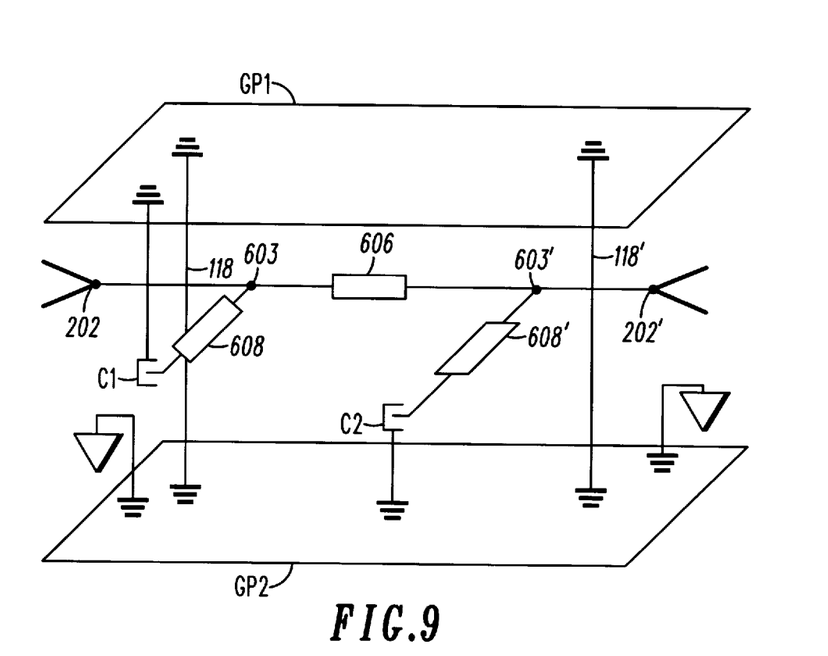
FIG. 9 shows an equivalent circuit diagram of a lowpass filter with the single point ground plane configuration in accordance with the present invention.

FIG. 8 and FIG. 9 show an equivalent circuit diagram of the present invention with and without ground vias. By comparing FIG. 8 with FIG. 9, the single point ground plane configuration of the present invention can be clearly seen.

FIG. 8 shows an equivalent circuit diagram of a lowpass filter without the single point ground plane configuration. In FIG. 8, a pi network design is provided. More specifically, the pi network is coupled between an input 202 and an output 202', comprising: a first leg including a first transmission line 608 and a first capacitance C1 connected to ground at both the top ground plane GP1 and the bottom ground plane GP2. A second leg including a second transmission line 608' and a second capacitance C2 connected to ground at both the top ground plane GP1 and the bottom ground plane GP2 is also provided. A middle leg, including a transmission line 606 is between the first and second legs. A first node 603 couples the input 202, the first leg, and the middle leg. A second node 603' couples the output 202', the middle leg, and the second leg. Ground vias 118, 118' are shown in FIG. 8 connecting the top and bottom ground planes GP1, GP2. From FIG. 8, it is clear that the capacitances C1, C2 are grounded to both the top and bottom ground planes GP1, GP2.

The single point ground plane configuration of the present invention can be seen with reference to FIG. 9. FIG. 9 shows an equivalent circuit diagram of a lowpass filter with the single point ground plane configuration. It is important to note not only that each leg is grounded to a separate ground plane, but also that this can be accomplished by either a side metallization technique or a through-hole ground via design.

Referring to FIG. 9, a pi network design is once again provided. More specifically, the pi network is coupled between an input 202 and an output 202', comprising: a first leg including a first transmission line 608 and a first capacitance C1 connected to ground at only the top ground plane GP1. A second leg, including a second transmission line 608' and a second capacitance C2 connected to ground at only the bottom ground plane GP2 is provided. A middle leg, including a transmission line 606 is between the first and second legs. A first node 603 couples the input 202, the first leg, and the middle leg. A second node 603' couples the output 202', the middle leg, and the second leg. Ground vias 118, 118' are shown in FIG. 8 connecting the top and bottom ground planes GP1, GP2. From FIG. 9, it is clear that the capacitances C1, C2 are grounded to opposite ground planes GP1 and GP2 respectively.

One advantage of the present design which grounds each leg to an opposite ground plane is that it solves a specific ground loop problem. Without a single point ground plane configuration, a ground loop may exist which effectively raises the ground potential of the first leg and the second leg above the input-output ground potential. This has the effect of creating a coupling path between the input 202 and output 202' pads which degrades the harmonic rejection of the lowpass filter.

By using separate ground planes for the first leg and the second leg, and connecting the ground planes at a single point near the input-output ground points, a ground loop which degrades the harmonic rejection of the lowpass filter is effectively eliminated.

The multilayer lowpass filter with improved ground plane configuration may be manufactured as follows:

A stack of green dielectric substrates are prepared and via holes are punched into these sheets at predetermined locations on the sheets. Dielectric ceramic green tape may be purchased directly from tape vendors or custom-formulated using a doctor-blade forming technique.

Conductive pastes are then screen printed on the dielectric substrates in predetermined patterns. Although screen printing is a common deposition technique in the industry, other deposition techniques may be employed.

The input pad and the output pad are then patterned on the exterior bottom surface of the filter using conventional screen printing or other pattern deposition techniques.

Then the dielectric green sheets are laminated together under a pressure of approximately 4500–5000 pounds per square inch (PSI) and a temperature of approximately 65–70 degrees Celsius using standard multilayer processing equipment.

Next, the entire laminated package is then fired at a temperature of approximately 870 degrees Celsius for complete densification of the package. By this firing process, the pressure adhering of the laminated dielectric sheets is secured and the conductive pastes are bonded to the dielectric sheets to form electrode patterns.

Next, the filters are tested to insure that all electrical specifications have been met and that the filters are free of physical defects such as cracking, delamination, uneven coating, or electrically shorted input and output pads.

Finally, the filters are packaged and sent to the customer.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed is:

1. A laminated lowpass filter comprising:
    a stack of dielectric substrates with a first-top ground plane disposed on a first dielectric substrate and a second-bottom ground plane disposed on a second dielectric substrate;
    a pi-type circuit network disposed on the stack of dielectric substrates coupled between an input and an output, comprising:
        a first leg including a first transmission line having a first inductive element and a first capacitance;
        a second leg including a second transmission line having a second inductive element and a second capacitance;
        a middle section including a transmission line between the first leg and the second leg;
        a first node coupling the input, the middle section and the first leg; and
        a second node coupling the output, the middle section and the second leg;
    a bidirectional grounding configuration including a first grounding structure and a second grounding structure wherein
        the first grounding structure comprises the first-top ground plane connected to the first leg of the pi-type circuit network only, and
        the second grounding structure comprises the second-bottom ground plane connected to the second leg of the pi-type circuit network only.

2. A laminated lowpass filter comprising:
    a stack of dielectric substrates with a first-top ground plane disposed on a first dielectric substrate and a second-bottom ground plane disposed on a second dielectric substrate;
    a pi-type circuit network disposed on the stack of dielectric substrates coupled between an input and an output, comprising:
    a first leg including a first transmission line having a first inductive element and a first capacitance;
    a second leg including a second transmission line having a second inductive element and a second capacitance;
    a middle section including a transmission line between the first leg and the second leg,
    a first node coupling the input, the middle section and the first leg; and
    a second node coupling the output, the middle section and the second leg;
    a bidirectional grounding configuration including a first grounding structure and a second grounding structure wherein
        the first grounding structure comprises the first-top ground plane connected to the second leg of the pi-type circuit network only, and
        the second grounding structure comprises the second-bottom ground plane connected to the first leg of the pi-type circuit network only.

3. The laminated lowpass filter of claim 1, wherein the pi-type circuit network provides a transmission zero at a second harmonic and a transmission zero at a third harmonic creating a frequency response including a steep slope between a fundamental frequency and the second harmonic.

4. The laminated lowpass filter of claim 1, wherein the stack of dielectric substrates substantially comprise ceramic materials.

5. The laminated lowpass filter of claim 1, wherein the laminated lowpass filter is disposed in a cellular telephone.

6. The laminated lowpass filter of claim 1, wherein the laminated lowpass filter is disposed in a transceiver circuit such that the input is connected to an antenna and the output is connected to at least one of a power amplifier and a receiver.

7. The laminated lowpass filter of claim 1, wherein the middle section comprises a helical transmission line.

8. The laminated lowpass filter of claim 1, wherein the second dielectric substrates further comprises an input pad for the input and an output pad for the output.

9. The laminated lowpass filter of claim 1, wherein the first leg of the pi-type circuit network is connected to the first-top ground plane by a conductive path on a side surface of the stack of dielectric substrates and the second leg of the pi-type network is connected to the second-bottom ground plane by a conductive path on the side surface of the stack of dielectric substrates.

10. The laminated lowpass filter of claim 1, wherein the first leg of the pi-type circuit network is connected to the first-top ground plane by a first ground via which extends from the first capacitance to the first-top ground plane and the second leg of the pi-type circuit network is connected to the second-bottom ground plane by a second ground via which extends from the second capacitance to the second-bottom ground plane.

* * * * *